United States Patent
Meng et al.

(10) Patent No.: US 8,828,881 B2
(45) Date of Patent: Sep. 9, 2014

(54) ETCH-BACK METHOD FOR PLANARIZATION AT THE POSITION-NEAR-INTERFACE OF AN INTERLAYER DIELECTRIC

(75) Inventors: Lingkkuan Meng, Beijing (CN); Huaxiang Yin, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/381,005

(22) PCT Filed: Aug. 10, 2011

(86) PCT No.: PCT/CN2011/001326
§ 371 (c)(1),
(2), (4) Date: May 20, 2013

(87) PCT Pub. No.: WO2012/092695
PCT Pub. Date: Jul. 12, 2012

(65) Prior Publication Data
US 2013/0040465 A1  Feb. 14, 2013

(30) Foreign Application Priority Data
Jan. 7, 2011 (CN) .......................... 2011 1 0003118

(51) Int. Cl.
*H01L 21/3065* (2006.01)
*H01L 21/3105* (2006.01)
*H01L 21/768* (2006.01)
*H01L 29/78* (2006.01)

(52) U.S. Cl.
CPC .......... *H01L 21/31055* (2013.01); *H01L 29/78* (2013.01); *H01L 21/76801* (2013.01)
USPC ................ 438/710; 438/715; 216/58; 216/67

(58) Field of Classification Search
USPC .............................. 438/710, 715; 216/58, 67
See application file for complete search history.

(56) References Cited

U.S. PATENT DOCUMENTS

| 4,676,868 A | * | 6/1987 | Riley et al. ..................... 438/697 |
| 5,461,010 A | | 10/1995 | Chen |
| 5,639,345 A | | 6/1997 | Huang |
| 5,679,211 A | | 10/1997 | Huang |
| 5,801,082 A | * | 9/1998 | Tseng ........................... 438/424 |
| 6,027,950 A | | 2/2000 | Harvey |

(Continued)

OTHER PUBLICATIONS

International Search Report PCT/CN2011/001326.

*Primary Examiner* — Shamim Ahmed
(74) *Attorney, Agent, or Firm* — Troutman Sanders LLP

(57) ABSTRACT

The invention discloses an etch-back method for planarization at the position-near-interface of an interlayer dielectric (ILD), comprising: depositing or growing a thick layer of $SiO_2$ by the chemical vapor deposition or oxidation method on a surface of a wafer; spin-coating a layer of SOG and then performing a heat treatment to obtain a relatively uniform stack structure; perform an etch-back on the SOG using a plasma etching, and stopping when approaching the position-near-interface of $SiO_2$; performing a plasma etch-back on the remaining SOG/$SiO_2$ structure at the position-near-interface until achieving a desired thickness. Since a two-step etching at the position-near-interface is employed, an extremely good smooth surface of the ILD is obtained. That is, a planar and tidy surface of the ILD is obtained not only in the center region, but also even at the edge of the wafer.

14 Claims, 4 Drawing Sheets

(56) References Cited

U.S. PATENT DOCUMENTS

| | | | |
|---|---|---|---|
| 6,255,229 B1 * | 7/2001 | Lin et al. | 438/761 |
| 6,376,911 B1 * | 4/2002 | Ryan et al. | 257/752 |
| 6,448,150 B1 * | 9/2002 | Tsai et al. | 438/427 |
| 6,475,917 B1 * | 11/2002 | Shen et al. | 438/712 |
| 7,754,611 B2 * | 7/2010 | Chen et al. | 438/692 |
| 2003/0148631 A1 * | 8/2003 | Kuo et al. | 438/782 |
| 2005/0048760 A1 * | 3/2005 | Wu | 438/622 |
| 2009/0102053 A1 * | 4/2009 | Han | 257/751 |

\* cited by examiner

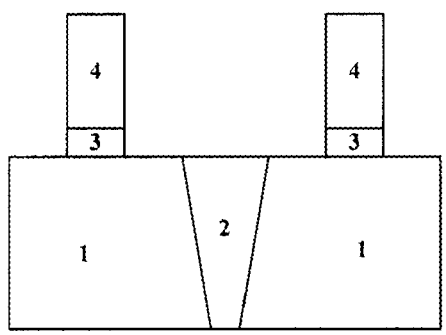
Fig. 1A --PRIOR ART--
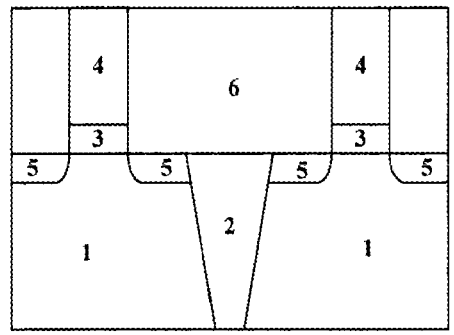
Fig. 1B --PRIOR ART--
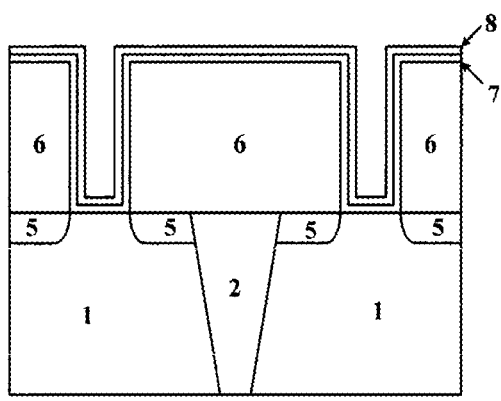
Fig. 1C --PRIOR ART--
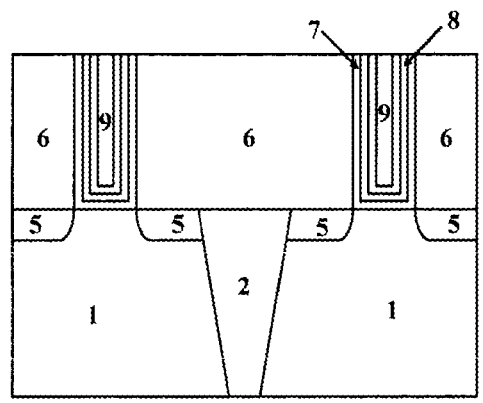
Fig. 1D --PRIOR ART--
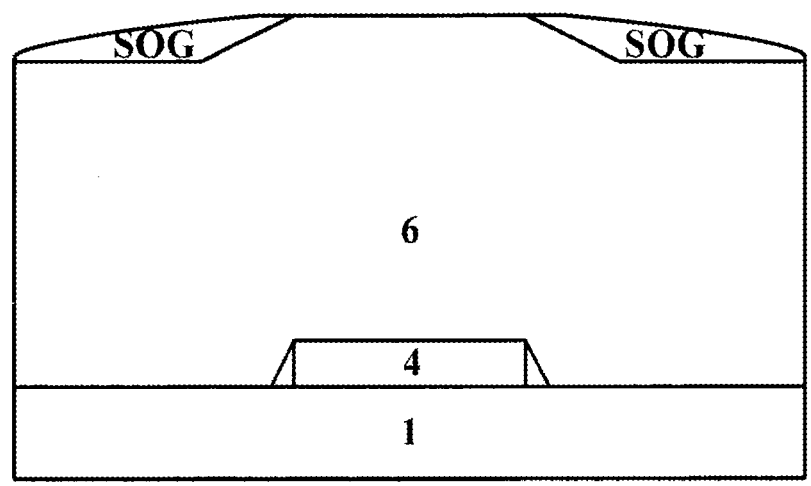
Fig. 2 --PRIOR ART--

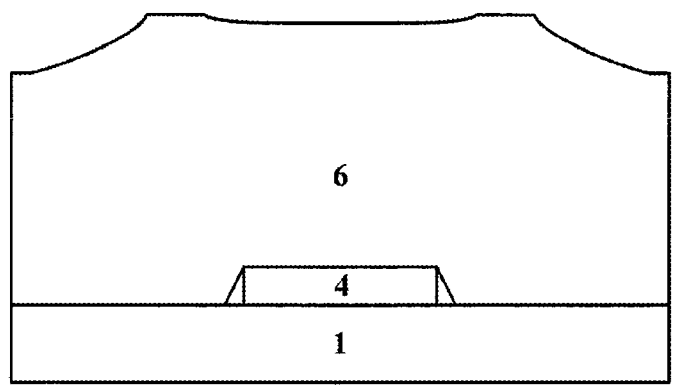
Fig. 3    --PRIOR ART--
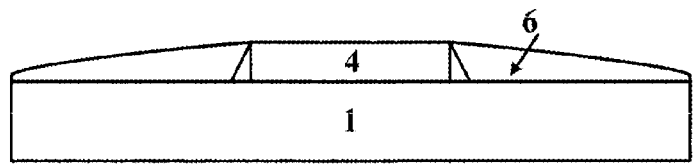
Fig. 4    --PRIOR ART--
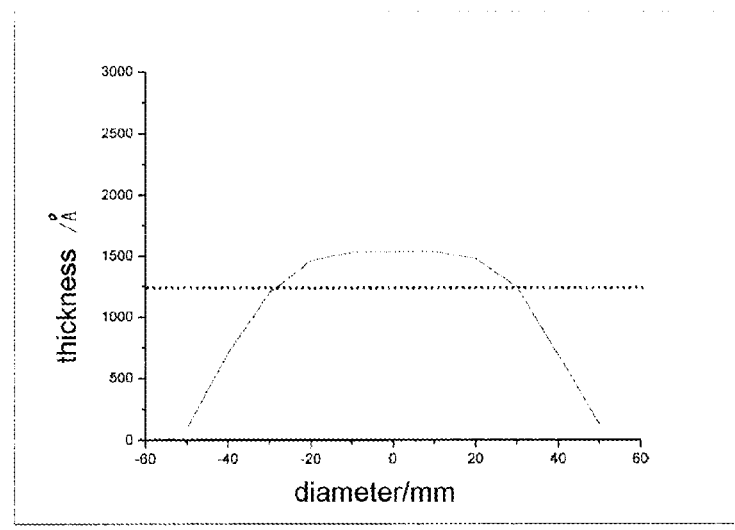
Fig. 5    --PRIOR ART--

ETCH-BACK METHOD FOR PLANARIZATION AT THE POSITION-NEAR-INTERFACE OF AN INTERLAYER DIELECTRIC

This application claims priority to Chinese Application No. 201110003118.6, filed on Jan. 7, 2011, titled "Etch-back method for planarization at the position-near-interface of an interlayer dielectric". The Chinese Application is incorporated herein by reference in its entirety.

FIELD OF THE INVENTION

The invention relates to the field of manufacturing a semiconductor integrated circuit, and more particularly, to an etch-back method for planarization at the position-near-interface of an interlayer dielectric (ILD).

BACKGROUND OF THE INVENTION

As the integrated circuit scales to 32 nm era, the requirements for planarizing an interlayer dielectric are increasingly high. In particular, the success of the mass production of the Intel 45 nm gate-last process promotes greatly the development of advanced technologies of the integrated circuit. Some new challenges and techniques continue to emerge, wherein the planarization of ILD layer for gate-last process is one of the key techniques, which does not exist in the traditional gate-first process.

However, since there is a significant difference in thickness between the surfaces of a polysilicon gate (a dummy gate) and structures on its opposite sides, after multilayer isolating dielectric materials are deposited, protrusions will be formed on a gate-line, causing the overall uniformity of a wafer surface to be poor. Therefore, a good uniformity on the dummy gate will have a significant influence on a subsequent process; otherwise, after the metal gate is filled, significant residuals will exist due to unevenness, resulting in the reliability problem of a device.

In order to improve the uniformity of a wafer, a conventional way is to firstly deposit a layer of $SiO_2$ or further deposit other dielectric layers to improve the electrical isolation performance of a device, and finally a layer of thick spin-on-glass (SOG) dielectric is spin-coated. Next, a heat treatment is performed at a certain temperature, which makes up for the non-uniformity due to the underlying dielectric by means of the excellent backflow performance of SOG. Then, SOG and $SiO_2$ are etched back and removed by means of the plasma etching method, until a planar and uniform surface is created on the dummy gate.

However, such an SOG etch-back method cannot provide a good etching uniformity, and results in that a variation in thickness between different regions on the whole wafer is extremely large, which is due to the fact that the etching rate at the edge is faster than that in the center region, which exacerbates such non-uniformity. The difference in etching rate between different regions results from that a polymer is produced during the etch-back of SOG. Since there is a pressure difference inside the etching chamber, the amount of remaining polymer in different regions determines the value of the etching rate. On the other hand, when etching a composite stack interface, the planarization of thickness is further deteriorated due to difference in etching rate and an etching non-uniformity in different dielectric materials.

In the following, reference is made to FIGS. 1-5 to explain a plasma etch-back technique employed to obtain a planar surface of the ILD or intermetal dielectric (IMD) in a conventional process for manufacturing a semiconductor device.

FIG. 1 shows the basic sequence of a gate-last production process. First, as shown in FIG. 1A, a pad oxide layer 3 is deposited on a substrate 1 with shallow trench isolation (STI) 2, and a dummy gate structure 4 is deposited on the pad oxide layer 3. The dummy gate structure 4 usually comprises a dummy gate of polysilicon or amorphous silicon and isolating spacers of usually nitride on opposite sides of the dummy gate, and may also comprise a capping layer of usually nitride on the dummy gate. Then, as shown in FIG. 1B, ion implant is performed using the dummy gate structure 4 as a mask to form a source/drain structure 5, preferably a lightly doped source/drain (LDD) structure in the substrate 1, and an ILD (denoted as 6 in FIG. 2) of usually oxide is deposited on the overall structure and an SOG is spin-coated, and after a heat treatment reflowing, a planar ILD layer 6 is formed by etching, until the dummy gate structure 4 is exposed. Next, as shown in FIG. 1C, usually the wet etching is adopted to remove the dummy gate structure 4 and the pad oxide layer 3. A gate oxide layer 7 of usually a high-k material such as $HfO_2$, $TiO_2$, $Ta_2O_5$, etc. is firstly deposited in a trench left in the ILD layer 6, and a first layer of metal 8, usually TiN, Ti, TaN or Ta or a combination thereof, is then deposited for improving the bonding strength between the materials. Finally, as shown in FIG. 1D, a second layer of metal 9, usually W, Cu, TiAl or Al or a combination thereof, is deposited as a gate metal layer. And polishing is performed, until the ILD layer 6 is exposed. Subsequently, the ILD is etched to form a contact hole structure.

In the step of planarizing the ILD layer 6 as shown in FIG. 1B, a conventional plasma etching process requires two-step etch-back to obtain a planar and uniform surface.

In the first step, an SOG etch-back is performed until reaching the $SOG/SiO_2$ interface. As shown in FIG. 2, obviously, a faster etching rate exists at the edge of the wafer as compared to the center region. When the etching arrives at the $SOG/SiO_2$ interface, the profile of thickness will be similar to a convex shape, as shown in FIG. 3. At the interface, as compared to the thickness in the center region, the edge thickness will be reduced greatly, since the etching already reaches the underlying oxide layer at the interface. The rates of the two layers above and below the interface differ. In particular, when etching the SOG of the upper layer, its etching rate is less than that of $SiO_2$ of the lower layer, which leads to a different etching thickness for a different region and causes the flatness to be reduced greatly.

Next, the second step of etch-back is performed, and a structure as shown in FIG. 4 is formed, of which the thickness is as shown in FIG. 5. In FIG. 5, the horizontal axis represents a distance from the center on the wafer (here taking a 4 inches wafer as an example, its diameter is 10 cm, and thus the whole horizontal axis represents a distance from −5 cm to 5 cm), and the vertical axis represents the thickness of the dielectric material after being etched, which may be measured using an interference metrology tool or an ellipsometer. The etching rate is obtained by measuring the thickness difference of the wafer before and after etching and dividing it by the time for etching. Obviously, the required profiles of thickness and etching rate can be obtained by measuring the thickness values at different positions on the wafer. Furthermore, during etching, since the dielectric materials on opposite sides of the interface differ, a different etching rate will bring about a very large difference in etching thickness. Even if etching back is performed at the same etching rate, the edge effect will tend to be more deteriorated due to the fact that it is difficult to control repeatability and reliability at the interface.

In view of the above, there is a need to provide a new etch-back method for planarizing a semiconductor device.

In U.S. Pat. No. 5,639,345 the planarization performance is improved by using a two-step etching, and in U.S. Pat. No. 5,679,211 a good uniformity is obtained by means of the oxygen in situ treatment. However, a treatment is not performed at the position-near-interface of the stack composite structure, but more just for the SOG layer. Therefore, there is a need to develop a process capable of improving the overall uniformity and obtain a planar surface.

Considering the etching problems encountered in a conventional process and a stack structure, the invention proposes to perform an equal etch rate etch-back at the position-near-interface for a composite stack structure, and obtains a good uniformity performance.

SUMMARY OF THE INVENTION

An object of the invention is to improve the uniformity of an $SOG/SiO_2$ stack structure applied in a gate-last process and filled with an interlayer dielectric (ILD) or an intermetallic dielectric (IMD). Further, an object of the invention is to improve the etch-back uniformity by a process of plasma etching at the position-near-interface.

The above object is achieved by providing a method for planarizing a stack structure constituted by a dielectric on a semiconductor structure, comprising:

performing a heat treatment on the stack structure to make it reflow;

performing a first etching, until approaching an interlayer interface of the stack structure;

performing a second etching, until the top of the semiconductor structure is exposed.

Wherein the semiconductor structure is a CMOS device fabricated by a gate-last process or an integrated circuit multilayer metal interconnection structure.

Wherein the stack structure comprises a dual-layer or multilayer structure constituted by a silicon oxide layer and an SOG layer on the silicon oxide layer. The silicon oxide layer is a dielectric material of BPSG, BSG or PSG prepared by chemical vapor deposition or thermal oxidation method. The thickness of the silicon oxide layer is from 2,000 Å to 20,000 Å, and the thickness of the SOG layer is from 2,000 Å to 20,000 Å.

Wherein the first etching and/or the second etching is a plasma etching, and the plasma etching gas comprises a fluorocarbon-based or fluorine-based gas which may contain oxygen. The fluorocarbon-based gas comprises any one or a combination of $CF_4$, $CH_2F_2$, $CH_3F$, $CHF_3$, $C_4F_6$, or $C_4F_8$, and the fluorine-based gas is $SF_6$. The plasma etching gas further comprises argon and oxygen, while oxygen may be used for performing a synchronous or subsequent in situ treatment to eliminate a polymer produced by the first etching.

Wherein the first etching employs a single-step, two-step or multiple-step plasma etch-back process. The distance between the stop position of the first etching and the interlayer interface of the stack structure is from 100 Å to 1,000 Å.

Wherein the etching rates of the first etching for the upper and lower layers of the stack structure are different, and the etching rate for the lower layer of $SiO_2$ is K times larger than that for the upper layer of SOG, wherein K is the ratio between thickness ranges of the upper and lower layers of the stack structure. The etching rates of the second etching for the stack structure close to the interlayer interface are identical.

Wherein the first etching and the second etching may be performed in the same chamber, or may also be performed in different etching chambers. The chamber is a plasma etching tool, a reactive ion etching tool, an inductively coupling etching tool, a cyclotron resonance etching tool or any other etching tool on the basis of the operation of a plasma source.

The innovative point of the invention lies in comprising a plasma etching for performing a single-step or multiple-step etch-back on SOG to eliminate the effect caused by the polymer generated when etching SOG, and an etch-back process in which the stack structure at the position-near-interface is etched at the same rate.

In addition, the invention may also be applied for the planarization of a multilayer stack filled with an interlayer dielectric (ILD) or an intermetal dielectric (IMD).

Finally, the invention obtains a planar surface at a lower cost relative to the CMP, and can be applied to a stack structure of dual-layer or multilayer dielectric materials.

BRIEF DESCRIPTION OF THE DRAWINGS

The technical solutions of the invention will be described in detail hereinafter with reference to the accompanying drawings, in which:

FIG. 1 is the basic sequence of the gate-last process, wherein the second step is a schematic view after forming an ILD layer and performing planarization;

FIG. 2 is the thickness demo profile after a plasma etch-back of SOG is performed by using a conventional process;

FIG. 3 is a schematic view of the thickness profile at interface of an $SOG/SiO_2$ stack structure after a plasma etch-back is performed by using a conventional process, wherein the thickness remaining after etching at the edge is clearly less than that at the center region;

FIG. 4 is the thickness demo profile after a plasma etch-back of an $SOG/SiO_2$ stack structure is performed using a conventional process;

FIG. 5 is a schematic view of the thickness profile after a plasma etch-back of an $SOG/SiO_2$ stack structure is performed using a conventional process;

DETAILED DESCRIPTION OF THE INVENTION

In the following, the features of the technical solutions of the invention and the technical effects thereof will be described in detail with reference to the accompanying drawings and in connection with exemplary embodiments. It should be noted that like reference numbers denotes like structures, and the terms "first", "second", "above", "below", "thick", and "thin", etc. used in this application may be used for describing various device structures. Such description does not suggest any spatial, order or hierarchical relationship among the described device structures, unless specifically stated.

Firstly, a basic semiconductor structure is formed, for example, a structure such as a gate-last structure of a CMOS device, an integrated circuit multilayer metal interconnection structure, etc is produced. In particular, the step of producing a basic structure of an gate-last structure of a CMOS device comprises: depositing a pad oxide layer (not shown) on a substrate 10 of usually silicon with an STI (not shown); depositing a dummy gate structure on the pad oxide layer, wherein the dummy gate structure usually comprises a dummy gate 30 of polysilicon (amorphous silicon) and isolating spacers 40 of usually nitride on opposite sides of the dummy gate, and may also comprise a capping layer (not shown) of usually nitride on the dummy gate; and then performing ion implant using the dummy gate structure as a mask to form a source/drain structure, preferably an LDD structure in the substrate 10. The IC multilayer metal interconnection structure is for example a Damascus structure known to the skilled in the art and will not be described here in detail.

Figure 6:
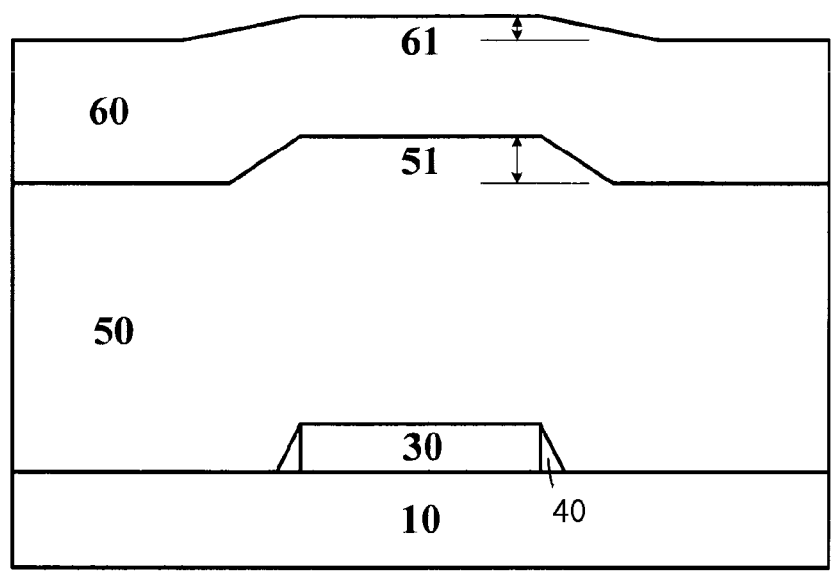
FIG. 6 is a schematic view of an initial $SOG/SiO_2$ stack structure according to the invention.

Then, with reference to FIG. 6, a stack structure of dielectrics is formed on the basic semiconductor structure. Between for example the spacers of the already formed basic semiconductor structure is deposited a relatively thick layer of dielectric material, usually an undoped USG (undoped silicate glass, i.e., $SiO_2$) material, for example, a low-temperature oxide (LTO) 50 to obtain a good insulation performance, which may also be a dielectric material such as boron phosphorus silicate glass (BPSG), borosilicate glass (BSG), phosphorus silicate glass (PSG), etc. prepared by chemical vapor deposition or thermal oxidation method, the thickness of which is for example from 2,000 Å to 20,000 Å. Then, a relatively thin layer of SOG 60 is spin-coated on the LTO 50, the thickness of which is for example from 2,000 Å to 20,000 Å, preferably 5,000 Å. In the embodiment and the figure is schematically shown only a two-layer stack structure, but it can be understood by the skilled in the art that a dielectric stack structure with more layers may also be employed to obtain a better insulation performance, for example, a three-layer, four-layer combined LTO-SOG stack structure. However, preferably, the top and the bottom of the stack structure are an SOG layer and an LTO layer, respectively.

It should be noted that since there is a significant difference in thickness between the surfaces of the dummy gate 30 and the structures on its opposite sides (which is mainly determined by the thicknesses of the dummy gate 30 and the spacers 40, i.e. determined by the thickness of a metal line layer or any other structures protruding from a surface for a structure like a multilayer metal interconnection structure, etc.). After multilayer isolating dielectric materials of the LTO and the SOG are deposited, protruding portions 51 and 61 will be formed on a gate-line, causing the overall uniformity of the wafer surface to become poor, and thus a heat treatment is also needed to be performed to cause the SOG reflow in order to achieve a better planarization effect and obtain a preliminary planar stack structure. The thickness of the protruding portion 51 of the LTO is determined by the parameters of the process for depositing the LTO as well as the thicknesses of the dummy gate 30 and the spacer 40. For example, it may be dependent on the flow of process gas, deposition temperature, etc. In particular, the thickness of the protruding portion 51 may be from 10 nm to 200 nm Next, with reference to FIG. 7, a first etching is performed on the stack structure of the LTO 50 and the SOG 60 using a plasma in a chamber of for example a plasma etching tool, a reactive ion etching tool, an inductively coupling etching tool or any other etching tool on the basis of the operation of a plasma, which mainly etches the SOG, until reaching the position-near-interface of the SOG/$SiO_2$. As shown in FIG. 8, the so-called position-near-interface is a plane of the SOG 60 close to the SOG/$SiO_2$ interface, particularly the protruding portion 51, and approximately parallel to the substrate 10. In particular, the plane of the position-near-interface may be 100 to 1,000 Å, namely, 10 to 100 nm, and preferably 300 Å, namely, 30 nm, from the SOG/$SiO_2$ interface, particularly the top of the protruding portion 51. In other words, the first etching of the stack structure stops at the position-near-interface between the stack structures.

In the first etching, in order to eliminate the effect caused by a polymer generated when etching the SOG, a plasma etching gas can be used for performing a synchronous or subsequent in situ treatment. The plasma etching gas may comprise a fluorocarbon-based gas, for example, $CF_4$, $CH_2F_2$, $CH_3F$, $CHF_3$, $C_4F_6$, or $C_4F_8$ and a combination thereof. The plasma etching gas may also be a combination of $SF_6$ and $O_2$. The fluorocarbon-based or fluorine-based plasma etching gas may also comprise oxygen. A synchronous or subsequent in situ treatment is performed to eliminate a polymer produced by the first etching. The first etching can employ a single-step, two-step or multiple-step plasma etch-back process. Since such a step of etch-back is not directly associated with the subject matter of the invention, it will not be described in detail here. They can be implemented by employing an existing single-step, two-step or multiple-step technique. They can also be implemented by a future developed technique, which will not affect the invention.

In particular, when etching the SOG, it is necessary to select a certain etching rate, i.e., to have a selectivity ratio for the lower layer of $SiO_2$. In the invention, the selectivity ratio of the etching rates for the SOG/$SiO_2$ is the ratio of the range of the thickness of the SOG (namely, the difference between the maximum and the minimum of the thickness) to the range of the thickness of $SiO_2$, which is expressed as 1/K (K>1). Assuming that the etching rate of the SOG is Ea, and the etching rate of the lower layer of $SiO_2$ is Eb, then Eb:Ea=K. It is clear that Eb=K Ea, and Ea:Eb=1/K.

Figure 7:
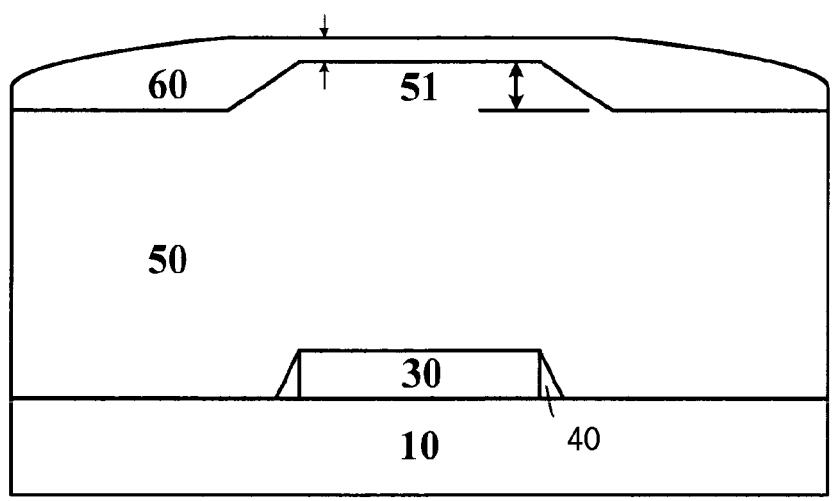
FIG. 7 is the thickness profile of an $SOG/SiO_2$ stack structure at the position-near-interface after eliminating the effect of a polymer using a plasma fluorocarbon-based gas in combination with a synchronous or subsequent $O_2$ treatment according to the invention.
Figure 8:
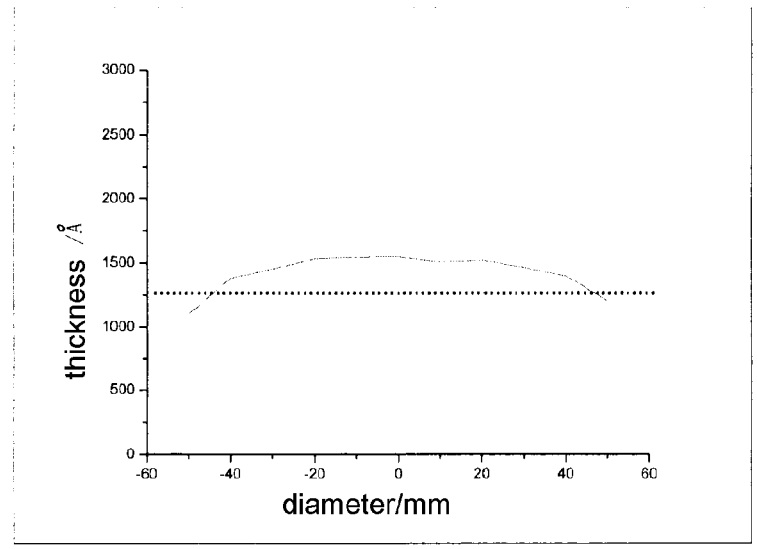
FIG. 8 is the surface thickness profile after a final etching of an $SOG/SiO_2$ stack structure according to the invention.

In the schematic view of the plasma etch-back until reaching the position-near-interface of the stack structure, as shown in FIG. 7, what is shown by the curve edge on opposite sides in the figure represents the etching difference between the edge and the center of the wafer.

Figure 9:
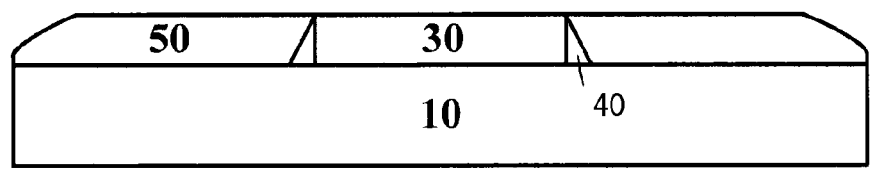
FIG. 9 is the surface thickness demo profile after a final etching of an $SOG/SiO_2$ stack structure according to the invention.

Then, a second etching is performed until reaching the desired surface, namely, until the dummy structure is exposed. The second etching may adopt the same plasma etching gas as the first etching to perform a constant rate etch-back at the position-near-interface. For example, the plasma etching gas may comprise the fluorocarbon-based or fluorine-based gas (e.g., $CF_4$, $CH_2F_2$, $CH_3F$, etc. and a combination thereof, which may contain oxygen, and the plasma etching gas may also be a combination of $SF_6$ and oxygen). That is, a plasma is used for etching the remaining SOG and the underlying LTO at the position-near-interface, the etching rate being Ec (different from Eb, and the recipe may be adjusted according to the etching effect). Since the etching rate is the same, the reliability of etching at the interface can be improved. Therein the difference in etching rate between in the center and at the edge of the wafer is as shown in FIG. 9. The chambers used by the second etching and the first etching may be the same, both being one and the same plasma etching tool, reactive ion etching tool, inductively coupling etching tool or any other etching tool on the basis of the operation of a plasma. There is no need for switching among a plurality of workstations. Therefore, the batch processing ability is improved, the time is saved and the cost is decreased.

As shown in FIG. 8, it is the surface thickness profile after a final etching of an SOG/$SiO_2$ stack structure according to the invention, wherein similar to FIG. 5, the horizontal axis represents a distance from the center on the wafer, the vertical axis represents the thickness of the dielectric material, which may be measured using an interference metrology tool or an ellipsometer. The etching rate is obtained by measuring the thickness difference of the wafer before and after etching and dividing it by the time for etching. Obviously, the required profile of thickness and profile of etching rate can be obtained by measuring the thickness values at different positions on the wafer.

By comparison of the data of the prior art (FIG. 5) and the invention (FIG. 8) and after a calculation, it can be seen that the effective area of the wafer is increased from the initial 60% to at least 80%, and the non-uniformity is decreased from 10% to 5%, thereby achieving a good planarization performance. Therein, the effective area is the area region where a device can work effectively on a wafer, in particular, as shown in FIGS. 5 and 8 by the dash-dotted line. The thickness of the dielectric below the dash-dotted line (corresponding to the thickness of the dielectric of 1250 Å) is thinner, which indicates that these regions are more over-etched, and in a subsequent process of filling a metal gate a metal will be filled therein and subsequent processes will be affected, which thus do not meet the requirement and not belong to an effective area region. As can be seen in the figures, the effective area region for FIG. 5 is within 30 mm from the center, and the effective area region for FIG. 8 is within 40 mm from the center. Furthermore, it is needed to add that, there are two kinds of characterization method for the non-uniformity of the thickness of the wafer surface and the etching rate, i.e., the range (the difference between the maximum and the minimum) non-uniformity and the deviation (the variance of all the measurement data) non-uniformity, then divided by two times the average, here a characterization is performed using the range non-uniformity. A result of calculation shows that, the invention improves the uniformity of the dielectric thickness greatly, thereby increasing the effective area of the wafer surface.

A cross section view of the resulting etched device structure is schematically shown in FIG. 9. As compared to the schematic view as shown in FIG. 4 obtained by the conventional process, since a two-step etching at the position-near-interface is employed, an extremely good smooth surface of the ILD is obtained, that is, a planar and uniform surface of the ILD is obtained not only in the center region, but also even at the edge of the wafer.

While the invention has been described with reference to one or more exemplary embodiment, it will be understood by the skilled in the art that various suitable changes and the equivalent thereof may be made to the method for forming a device structure without departing from the scope of the invention. Furthermore, from the disclosed teachings many modifications possibly suitable for particular situations or materials may be made without departing from the scope of the invention. Therefore, the aim of the invention is not intended to be limited to the particular embodiments disclosed as the best implementations for implementing the invention. The disclosed device structure and the method for manufacturing the same will comprise all the embodiments falling within the scope of the invention.

The invention claimed is:

1. A method for planarizing a stack structure constituted by a dielectric layers on a semiconductor structure, comprising:
    performing a heat treatment on the stack structure to make it reflow;
    performing a first etching, until approaching an interlayer interface between the dielectric layers in the stack structure; and
    performing a second etching, until the top of the semiconductor structure is exposed, wherein etching rates of the second etching for the dielectric layers in the stack structure close to the interlayer interface are identical,
    wherein a distance between a stop position of the first etching and the interlayer interface of the stack structure is from 100 Å to 1,000 Å.

2. The method as claimed in claim 1, wherein the semiconductor structure is a CMOS device fabricated by a gate-last process or an integrated circuit multilayer metal interconnection structure.

3. The method as claimed in claim 1, wherein the stack structure comprises a dual-layer or multilayer structure constituted by a silicon oxide layer and an SOG layer on the silicon oxide layer.

4. The method as claimed in claim 3, wherein the silicon oxide layer is a dielectric material of BPSG, BSG or PSG prepared by chemical vapor deposition or thermal oxidation method.

5. The method as claimed in claim 3, wherein the thickness of the silicon oxide layer is from 2,000 Å to 20,000 Å, and the thickness of the SOG layer is from 2,000 Å to 20,000 Å.

6. The method as claimed in claim 1, wherein the first etching and/or the second etching is a plasma etching.

7. The method as claimed in claim 6, wherein the plasma etching gas comprises any one or a combination of CF4, CH2F2, CH3F, CHF3, C4F6, C4F8.

8. The method as claimed in claim 6, wherein the plasma etching gas is SF6 and O2.

9. The method as claimed in any one of claims 6-8, wherein the plasma etching gas further comprises oxygen to perform a synchronous or subsequent in situ treatment to eliminate a polymer produced by the first etching.

10. The method as claimed in claim 6, wherein the first etching employs a single-step, two-step or multiple-step plasma etch-back process.

11. The method as claimed in claim 1, wherein a selectivity ratio of the etching rates of the first etching for the stack structure is 1/K, wherein K is the ratio between thickness ranges of the lower and upper layers of the stack structure.

12. The method as claimed in claim 1, wherein the first etching and the second etching are performed in the same chamber.

13. The method as claimed in claim 12, wherein the chamber is an etching tool on the basis of the operation of a plasma source.

14. The method as claimed in claim 13, wherein the etching tool on the basis of the operation of a plasma source is a plasma etching tool, a reactive ion etching tool, an inductively coupling etching tool, or a cyclotron resonance etching tool.

* * * * *